(12) United States Patent
Straub

(10) Patent No.: US 6,760,497 B1
(45) Date of Patent: Jul. 6, 2004

(54) PRINTED CIRCUIT BOARD FOR ELECTRICAL AND OPTICAL SIGNALS AND METHOD FOR PRODUCING THE SAME

(75) Inventor: Peter Leo Straub, Oberwil/Zug (CH)

(73) Assignee: PPC Electronic AG, Cham (CH)

( * ) Notice: Subject to any disclaimer, the term of this patent is extended or adjusted under 35 U.S.C. 154(b) by 0 days.

(21) Appl. No.: 09/913,917

(22) PCT Filed: Feb. 2, 2000

(86) PCT No.: PCT/CH00/00056

§ 371 (c)(1),
(2), (4) Date: Jan. 16, 2002

(87) PCT Pub. No.: WO00/50946

PCT Pub. Date: Aug. 31, 2000

(30) Foreign Application Priority Data

Feb. 23, 1999 (CH) .................................................. 335/99

(51) Int. Cl.[7] .................................................. G02B 6/12
(52) U.S. Cl. ........................ 385/14; 385/129; 385/130; 385/131; 385/132
(58) Field of Search .......................... 385/14, 129, 130, 385/131, 132

(56) References Cited

U.S. PATENT DOCUMENTS

| 5,249,245 A | 9/1993 | Lebby et al. |
|---|---|---|
| 5,271,083 A | 12/1993 | Lebby et al. |
| 6,324,328 B1 * | 11/2001 | Mehlhorn et al. .......... 385/131 |
| 6,438,281 B1 * | 8/2002 | Tsukamoto et al. ........... 385/14 |
| 2002/0097962 A1 * | 7/2002 | Yoshimura et al. ........... 385/50 |

FOREIGN PATENT DOCUMENTS

| EP | 0581012 | 2/1994 | |
| JP | 40-6167622 A | * 6/1994 | .................. 385/14 |
| WO | WO9001176 | 2/1990 | |

* cited by examiner

Primary Examiner—Rodney Bovernick
Assistant Examiner—Sung Pak
(74) Attorney, Agent, or Firm—Tarolli, Sundheim, Covell & Tummino L.L.P.

(57) ABSTRACT

The invention relates to a printed circuit board (30) which has at least one electrical conduction level (EL) for relaying electrical signals and/or currents and at least one optical conduction level (OL) for relaying optical signals. Said conduction levels (EL, OL) are placed on top of each other in a stack inside the printed circuit board (30) and are interconnected. The aim of the invention is to provide a particularly flexible and simple construction and a simplified production method. To this end, the optical conduction level (OL) comprises at least one thin glass layer (11) as a conductor element.

21 Claims, 4 Drawing Sheets

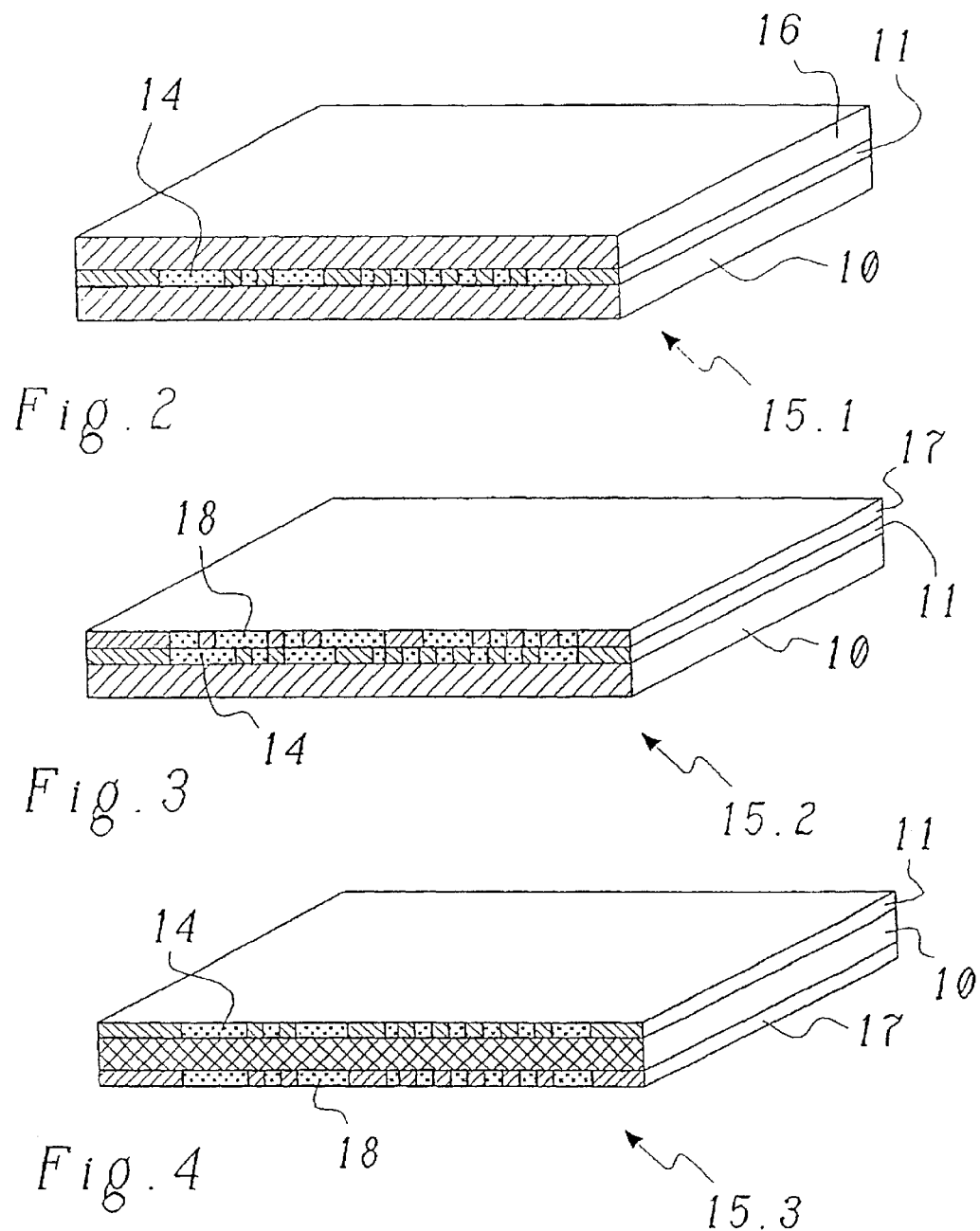

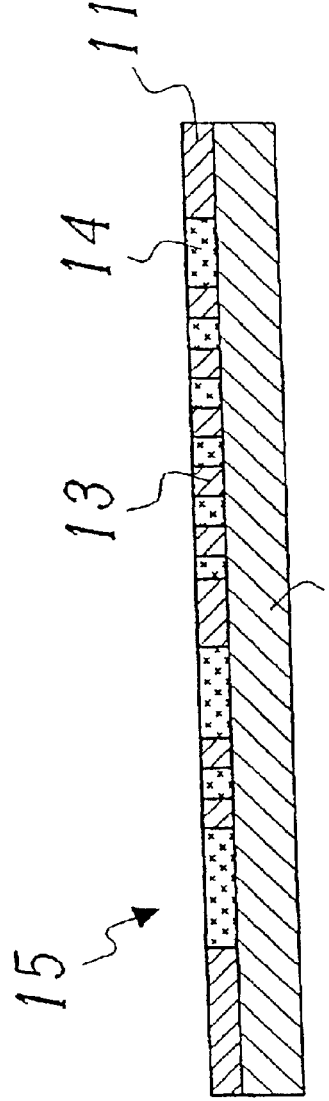
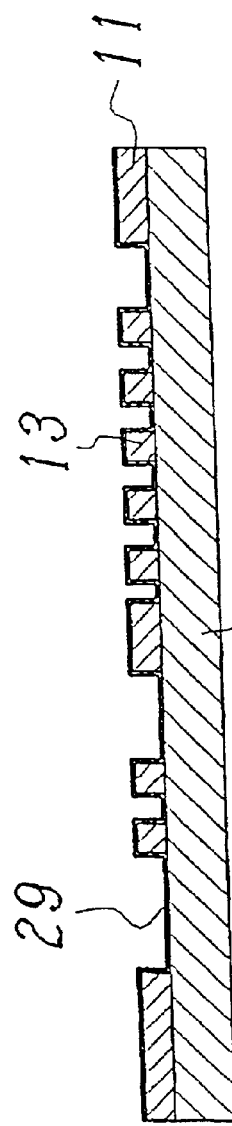

PRINTED CIRCUIT BOARD FOR ELECTRICAL AND OPTICAL SIGNALS AND METHOD FOR PRODUCING THE SAME

TECHNICAL BACKGROUND

The present invention relates to the field of circuit board technology. It concerns a circuit board having at least one electrical conduction level for relaying electric signals and/or currents and at least one optical conduction level for relaying optical signals, said conduction levels being interconnected and arranged one above the other in a stack within the printed circuit board.

Such a circuit board is disclosed, for example, in the publication U.S. Pat. No. 5,408,568 A.

This invention also relates to a method of producing such a circuit board.

STATE OF THE ART

In the long run, the demand for higher and higher clock rates and faster and faster signal transmission cannot be met with an adequate quality by using copper lines. Through the use of optical transmission pathways (optical fibers) it is possible to transmit signals at extremely high transmission rates within a backplane and also on system boards. A high interference immunity with respect to electromagnetic interference is a very fortunate side effect which is important especially on an electric backplane. Such a backplane is responsible, for example, for the data exchange between the individual processor cards of a multiprocessor high performance computer.

Various proposals have already been made for integrating optical data transmission pathways into multilayer circuitboards. For example, U.S. Pat. No. 5,230,030 A describes an optical interface for coupling to an electronic circuit in the form of multichip modules. The individual ICs are mounted on a multilayer circuit board consisting of layers that conduct electricity, arranged in alternation with insulating layers in the form of a stack. Channels are created in the insulating layers, which consist of an optically transparent material having a low refractive index, and are then filled with another transparent plastic having a higher refractive index. The fillings then form optical conductors which are connected to the ICs on the one hand and on the other hand are led to the edge of the stack, where they can be connected externally by means of an appropriate plug. This method of integrating optical conductors into a circuit board is not only complicated because the circuit board must be built up and structured layer for layer in succession, but also the quality of the optical conductors produced in this way leaves much to be desired because it is very difficult to achieve a uniform and homogeneous conductor structure when filling the channels with the optically active material.

Another proposal which is disclosed in U.S. Pat. No. 5,408,568 A cited above integrates a whole-area optical layer as an intermediate layer into a multilayer circuit board. The optical layer is coupled to the outside by means of an optical fiber with a blunt connection on one end. Chips placed on the top side of the circuit board are connected through holes beneath the chips, extending to the optical layer. The optical layer acts as a uniform optical databus over which all chips can exchange data with each other or with the outside world. No statements are made in that publication regarding the thickness or material of this optical layer. FIG. 1 of that publication illustrates the optical layer with the same thickness as the printed circuitboards between which it is arranged. Therefore, this type of design could not be suitable for circuitboards having multiple optical levels and defined optical connections between selected chips.

EXPLANATION OF THE INVENTION

Therefore, the object of this invention is to create a circuit board for electrical and optical signals which is characterized by a high quality of the optical connection, a flexibly adaptable and easily varied design and simple integration into known manufacturing methods for multilayer circuitboards.

This object is achieved with a circuit board of the type defined in the preamble by the fact that the optical conduction level as a conducting element comprises at least one thin glass layer. A thin glass layer is understood to refer to a sheet-like layer of glass with a small thickness (approximately 1 mm thick or less) but at the same time a high optical quality (planarity of the surfaces) such as that used for LCD displays, solar cells or as a cover for a CCD circuit. Due to the use of such thin glass layers, it is possible to provide within the circuit board one or more space-saving optical conduction levels of a high transmission quality which can also be structured easily as needed to implement a localized optical connection within the circuit board, A first preferred embodiment of the circuit board according to this invention is characterized in that the optical conduction level is formed by an optical sandwich which comprises, in addition to the minimum of one thin glass layer, at least one carrier plate which is connected to the minimum of one thin glass layer over the surface. Due to the combination of the thin glass layer with a carrier plate, it is possible to prefabricate the resulting optical sandwich separately from the fabrication of the actual circuit board and to adapt it in a flexible manner to the prevailing needs of the circuit (e.g. by structuring). The prefabricated optical sandwich can be introduced as an additional conduction level or layer into a traditional manufacturing process for a multilayer circuit board without requiring any significant changes in the process management.

It is possible here for the optical sandwich to comprise at least two carrier plates with the minimum of one thin glass layer arranged between them. The thin glass layer is then completely protected for further processing. However, it is also equally possible for the optical sandwich to comprise at least two thin glass layers which are connected to the minimum of one carrier plate over the area, with either the minimum of two thin glass layers being arranged on one side of the minimum of one carrier plate and joined together over the area or the minimum of two glass layers being arranged on opposite sides of the minimum of one carrier plate. In this way, two different optical conduction levels that can be designed separately can be integrated into the circuit board per optical sandwich. Of course, the number of carrier plates and thin glass layers per optical sandwich can also be increased further within the scope of this invention, although this does make production more complicated.

A second preferred embodiment of the circuit board according to this invention is characterized in that the carrier plates are made of an electrically insulating material which is used as the basic material for the production of electric circuitboards, preferably an Aramid-reinforced resin. This guarantees that the optical sandwich can be introduced especially well into the traditional manufacturing process for multilayer circuitboards.

The thin glass layers preferably have a thickness of less than or equal to 1.1 mm and are made of a borosilicate glass.

Such a thin glass which is available under the brand names AF 45 and D 263 from the German company DESAG for use in LCD displays or solar cells, for example, and which is available in thicknesses between 30 μm and 1.1 mm is especially suitable as the optical conduction layer because of its high optical quality.

Essentially the thin glass layer may remain unstructured, then forming a single, continuous, cohesive optical layer. Another preferred embodiment of the circuit board according to this invention, however, is characterized in that at least individual thin glass layers are structured in such a way as to form individual optical conductors within the layer, separated from one another by interspaces. In this way, a variety of independent optical conductors can be produced in one level and can assume different transmission functions without causing any mutual interference.

The optical properties of the individual optical conductors can be optimized either by covering the exposed surfaces of the individual optical conductors with a reflective layer or by filling the interspaces between the optical conductors with a filling material which has a lower refractive index than the refractive index of the glass of the thin glass layer in particular.

Another preferred embodiment of the circuit board according to this invention is characterized in that coupling openings are provided for optical coupling of optically active elements arranged on the top and/or bottom sides of the circuit board, so that the concealed thin glass layer or optical conductors inside an optical conduction level is/are accessible from the outside.

The method according to this invention for producing a circuit board is characterized in that in a first step, at least one thin glass layer is joined to at least one carrier plate over the entire area to form an optical sandwich, and in a second step the optical sandwich is connected to the circuit board as an optical conduction level having one or more electrical conduction levels in a stack arrangement, with the thin glass layer and the carrier plate preferably being joined together by pressing and/or gluing.

Additional embodiments are derived from the dependent claims.

BRIEF EXPLANATION OF THE FIGURES

This invention will now be explained in greater detail below on the basis of embodiments in conjunction with the drawings, which show:

FIG. 2 an alternative embodiment to FIG. 1D with a thin glass layer between two carrier plates;

FIG. 3 an alternative embodiment to FIG. 1D with two thin glass layers arranged one above the other on one side of the carrier plates;

FIG. 4 an alternative embodiment to FIG. 1D with two thin glass layers on opposite sides of the carrier plate;

FIG. 5 an enlarged sectional diagram of the optical sandwich according to FIG. 1D with the interspaces of the structured thin glass layer filled by an optically adapted filling material;

FIG. 6 an alternative embodiment to FIG. 5B with a cover over the structured thin glass layer formed by a reflective layer.

METHODS OF EMBODYING THIS INVENTION

Figure 1A:
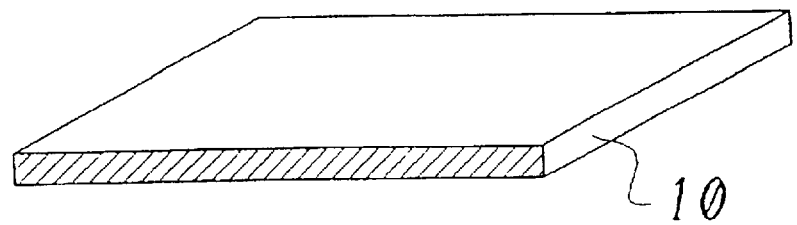
FIGS. 1A–D various stages in the production of an "optical sandwich" with a structured thin glass layer according to a preferred embodiment of this invention, shown in a perspective, partially cut-away view.

In production of the circuit board according to this invention, individual so-called "optical sandwiches" are produced first, to form the optical conduction level in a future circuit board. The optical sandwich is produced in several steps which are shown as an example in FIGS. 1A–1D, starting with a carrier plate 10 (FIG. 1A), which has planer surfaces on the top and bottom sides and is made of an electrically insulating material such as that used for the production of electrical circuitboards. This ensures that the finished optical sandwich can be integrated well into existing circuit board processes from the standpoint of its material properties. The material used for this is preferably an Aramid-reinforced resin. Such carrier plates are available under the brand name Duramid-P-Cu 115ML from the German company Isola, for example. However, any other insulation material having isotropic properties and a coefficient of expansion like that of glass can also be used. The thickness of carrier plate 10 is selected so that carrier plate 10 imparts a sufficient mechanical stability to the optical sandwich, but on the other hand does not take up an unnecessary amount of height in subsequent integration into the circuit board.

Figure 1B:
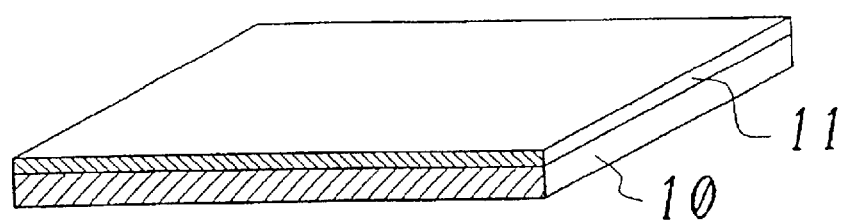

Carrier plate 10 is then joined to a thin glass layer 11 by pressing or gluing over the entire area according to FIG. 1B. The thin glass layer 11 is preferably made of a borosilicate glass and has a thickness of less than or equal to 1.1 mm (30 μm to 1.1 mm). Thin glass of this type is available under the brand names AF 45 and D 263 from the German company DESAG, for example. Thin glass AF 45 is a modified borosilicate glass with a high BaO and $Al_2O_3$ content and is characterized by a low thermal expansion coefficient and a high light transmission value. Due to low tolerances and flame-polished surfaces, this type of glass is especially suitable for large-area optical applications such as LCD displays, covers for CCD elements, solar cells or the like. Thin glass D 263 is a borosilicate glass with corresponding optical properties. Both of these thin glasses are available in a thickness in the range between 30 μm to 1.1 mm.

Figure 1C:
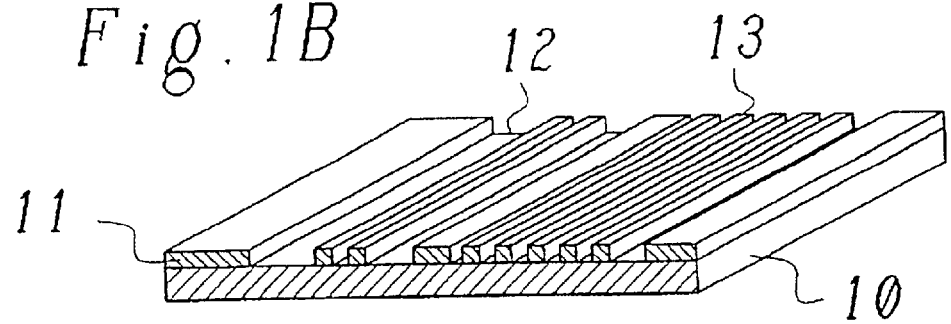
Figure 1D:
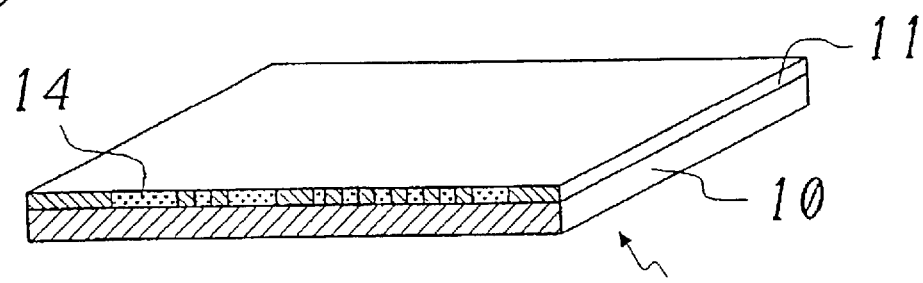
Figure 7:
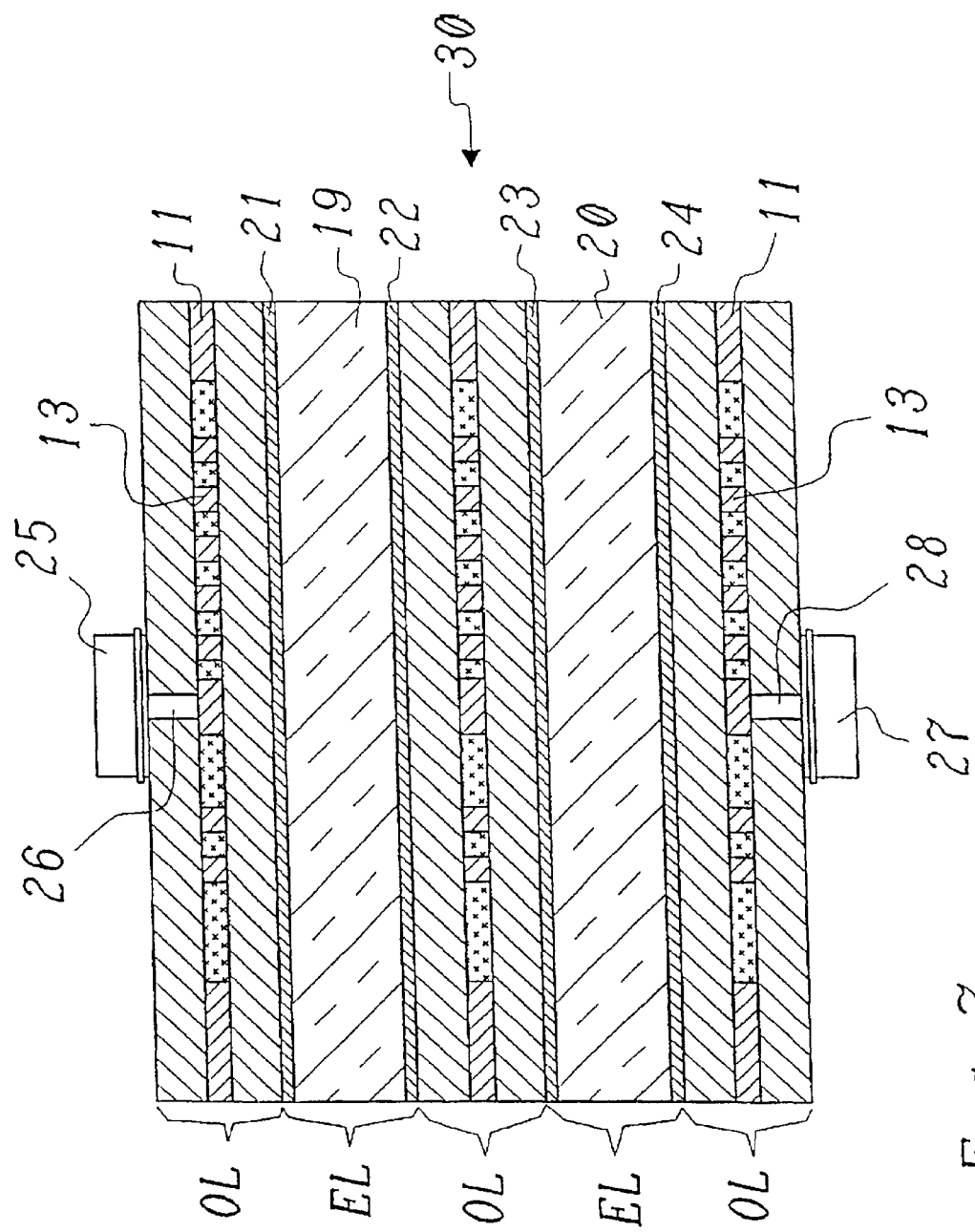
FIG. 7 an embodiment of a circuit board according to this invention with three optical conduction levels (sandwiches) according to FIG. 2, separated from one another by two electrical conduction levels arranged between them.

If the optical conduction level is provided only as a common databus in the subsequent circuit board, then an optical sandwich can be integrated directly into the circuit board with an unstructured thin glass layer according to FIG. 1B (see FIG. 7). However, if individual optical conduction connections are needed between different points in the plate, the thin glass layer is then structured according to FIG. 1C after creation of the optical sandwich by completely removing the thin glass layer in certain areas to form interspaces 12 between individual optical conductors 13. The individual optical conductors 13 may have different areas (as shown in FIG. 1C). They may run parallel to one another and may have the same or different lengths, but they may also be bent or shaped in some other manner in as much as this is consistent with their function as an optical conductor. Interspaces 12 can be created by different techniques. A mechanical method of production by grinding or milling is conceivable, but removal by means of a laser or by chemical methods is also conceivable.

After the thin glass layer 1 has been structured, the resulting interspaces 13 are filled with a filling material 14 to complete the optical sandwich 15 (FIG. 1B and FIG. 5). This filling operation has the advantage that a mechanically stable planer surface is formed on the top side of thin glass layer 11. On the other hand, if filling material 14 has a refractive index lower than the refractive index of the glass of thin glass layer 11, then this filling material ensures total reflection in optical conductors 13 and thus ensures good optical conduction properties. However, the same good optical conduction properties can also be achieved if the free surfaces of the structured thin glass layer 11 or the optical conductor 13 are coated with a preferably metallic reflective layer 29 by vapor deposition or by galvanic or chemical deposition in optical sandwich 15.4, as illustrated in FIG. 6. Again in this case, the remaining interspaces may be filled subsequently with a filling material for mechanical reasons.

Instead of the optical sandwich 15 from FIG. 1B composed of two layers 10 and 11, optical sandwiches comprising more than two layers may also be used. In the case of optical sandwich 15.1 from FIG. 2, the thin glass layer 11 is joined to carrier plates 10 and 16 on both sides. This further increases its mechanical stability. At the same time, optical sandwich 15.1 has the circuit board material of carrier plates 10 and 16 as the connecting surface on the top and bottom sides and therefore it can be integrated especially well into the circuit board manufacturing process.

In the case of the optical sandwich 15.2 from FIG. 3, a second structured thin glass layer 17 is arranged above the first structured thin glass layer 11 and forms a second optical conduction level and thus provides additional optical connections within the circuit board without taking up much space. In the case of the second thin glass layer 17, the interspaces are preferably also filled by a filling material 18.

Finally, in the case of the optical sandwich 15.3 from FIG. 4, a structured thin glass layer 11 and 17 is provided with interspaces filled with filling material 14 and 18 on the opposite sides of carrier plate 10, thus providing a clear separation between thin glass layers 11 and 17. It is self-evident that other combinations of thin glass layers and carrier plates are also conceivable within the scope of this invention.

The finished optical sandwiches 15 and 15.1 through 15.4 can then be combined in a stack with traditional electric circuitboards that are metallized on both sides and connected to form a finished circuit board for optical and electrical signals. The mechanical stability of these sandwiches permits problem-free integration into the production process. One such circuit board 30 shown as an example has three optical conduction levels and two electrical conduction levels, as illustrated in a sectional view in FIG. 7. The (three) optical conduction levels OL of the circuit board 30 are formed by three optical sandwiches 15.1 according to FIG. 2. Two electrical conduction levels EL are arranged in alternation between the optical conduction levels OL, each consisting of a dielectric layer 19 and 20 in a traditional manner, coated on both sides with a metal layer 21, 22 and 23, 24 (e.g., copper lamination). All the layers are pressed or glued together. Both the thin glass layers of optical conduction levels OL and the metal layers of electrical conduction levels EL are structured according to the requirements of circuit board 30, where the structuring of electrical conduction levels EL is accomplished in a known manner (e.g., by etching the metal layers 21–24); structuring of metal layers 21–24 is not illustrated in FIG. 7 for the sake of simplicity. Of course, through-contacts such as those known and conventionally used in the technology of multilayer circuitboards may also be provided between electrical conduction levels EL.

If optically active elements or chips 25, 27 are to be connected to each other or to optical inputs or outputs, plug connections or the like through the optical conduction levels OL, then coupling openings 26, 28 are introduced into the circuit board 30 for optical coupling of the elements 25, 27 arranged on the top and/or bottom sides of the circuit board 30, these coupling openings providing access from the outside to thin glass layers 11 and optical conductors 13 which are concealed and lie in an optical conduction level OL. Accordingly, purely electronic chips which are arranged on the circuit board can be connected to electric conduction levels EL by means of through-contacts (not shown in FIG. 7).

LIST OF REFERENCE NOTATION 10, 16 carrier plate
11, 17 thin glass layer
12 interspace
13 optical conductor
14, 18 filling material
15; 15.1–15.3 optical sandwich
19, 20 dielectric layer
21–24 metal layer (e.g., Cu)
25, 27 optically active element (optical chip)
26, 28 coupling opening
29 reflective layer
30 circuit board
EL electrical conduction level
OL optical conduction level

What is claimed is:

1. A circuit board (30) having at least one electrical conduction level (EL) for relaying electrical signals and/or currents as well as at least one optical conduction level (OL) for relaying optical signals, said conduction levels (EL, OL) being interconnected and arranged in a stack one above the other within the circuit board, characterized in that the optical conduction level (OL) as a conducting element comprises at least one thin glass layer (11, 17) in the form of a prefabricated thin glass sheet made of a borosilicate glass and having a thickness of less than or equal to 1.1 mm.

2. The circuit board according to claim 1, characterized in that the optical conduction level (OL) is formed by an optical sandwich (15; 15.1 , . . . , 15.3) comprising, in addition to the minimum of one thin glass layer (11, 17), at least one carrier plate (10, 16) which is joined to the minimum of one thin glass layer (11, 17) over the area.

3. The circuit board according to claim 2, characterized in that the optical sandwich (15.1) comprises at least two carrier plate (10, 16) with a minimum of one thin glass layer (11) arranged between them.

4. The circuit board according to claim 2, characterized in that the optical sandwich (15.2, 15.3) comprises at least two thin glass layers (11, 17) which are joined over the area to the minimum of one carrier plate (10).

5. The circuit board according to claim 4, characterized in that the minimum of two glass layer (11, 17) are joined together over the area and are arranged on one side of the minimum of one carrier plate (10).

6. The circuit board according to claim 4, characterized in that the minimum of two glass layers (11, 17) are arranged on opposite sides of the minimum of one carrier plate (10).

7. The circuit board according to claim 2, characterized in that the carrier plate (10, 16) are each made of an electrically insulating material which is used as the base material for the production of electric circuit boards.

8. The circuit board according to claim 7, characterized in that said carrier plates (10, 16) are each made of an Aramide reinforced resin.

9. The circuit board according to claim 1, characterized in that the thin glass layers (11, 17) and the carrier plates (10, 16) are glued or pressed together.

10. The circuit board according to claim 1, characterized in that at least individual layers of the thin glass layers (11, 17) are designed as continuous layers.

11. The circuit board according to claim 1, characterized in that at least individual layers of the thin glass layers (11, 17) are structured so as to form individual optical conductors (13) within the layer, separated from one another by interspaces (12).

12. The circuit board according to claim 11, characterized in that the exposed surfaces of the individual optical conductors (13) are covered with a reflective layer (29).

13. The circuit board according to claim 11, characterized in that the interspaces (12) between the optical conductors (13) are filled with a filling material (14, 18).

14. The circuit board according to claim 1, characterized in that coupling openings (26, 28) are provided for optical coupling of optically active elements (25, 27) arranged on the top and or bottom sides of the circuit board (30), so that the concealed thin glass layers (11, 17) or optical conductors (13) located in an optical conduction level (OL) are accessible from the outside through these coupling openings.

15. A method of producing a circuit board comprising the steps of:

joining at least one thin glass layer (11, 17) comprising a prefabricated thin glass sheet made of a borosilicate glass and having a thickness of less than or equal to 1.1 mm over the entire area to at least one carrier plate (10, 16) to form an optical sandwich (15; 15.1, . . . , 15.3), and connecting the optical sandwich (15; 15.1, . . . , 15.3) to the circuit board (30) to form an optical conduction level (OL) having one or more electrical conduction levels (EL) in a stack arrangement.

16. The method according to claim 15, characterized in that the thin glass layer (11, 17) and the carrier plate (10, 16) are joined together by pressing or gluing.

17. The method according to claim 15, characterized in that the thin glass layer (11, 17) joined to the carrier plate (10, 16) is structured between the first and second steps.

18. The method according to claim 17, characterized in that the thin glass layer is removed in certain predetermined areas in order to structure the thin glass layer (11, 17) to form individual optical conductors (13) separated from one another by interspaces (12).

19. The method according to claim 18, characterized in that the removal of the thin glass layer (11, 17) is accomplished by means of lasers or by mechanical or chemical methods.

20. The method according to claim 17, characterized in that the free surface area of the structured thin glass layer (11) is coated with a reflective layer (29), preferably made of a metal, by vapour deposition, galvanic or chemical deposition.

21. The method according to claim 18, characterized in that the interspaces (12) in the structured thin glass layer (11, 17) are filled with a filling material (14, 18) having a refractive index lower than the refractive index of the glass of the thin glass layer (11, 17).

* * * * *